(12) United States Patent
Hofer

(10) Patent No.: US 9,497,858 B2
(45) Date of Patent: Nov. 15, 2016

(54) COMPOSITE COMPONENT WITH ELECTRICAL LINES

(71) Applicant: MAGNA STEYR Fahrzeugtechnik AG & Co KG, Graz (AT)

(72) Inventor: Bernhard Hofer, Graz (AT)

(73) Assignee: MAGNA STEYR Fahrzeugtechnik AG & Co KG, Graz (AT)

( * ) Notice: Subject to any disclaimer, the term of this patent is extended or adjusted under 35 U.S.C. 154(b) by 0 days.

(21) Appl. No.: 14/045,842

(22) Filed: Oct. 4, 2013

(65) Prior Publication Data

US 2014/0097011 A1 Apr. 10, 2014

(30) Foreign Application Priority Data

Oct. 4, 2012 (EP) ..................... 12187229

(51) Int. Cl.
*H05K 1/02* (2006.01)
*H05K 1/03* (2006.01)
(Continued)

(52) U.S. Cl.
CPC ............. *H05K 1/038* (2013.01); *B29C 70/885* (2013.01); *H05K 1/0366* (2013.01);
(Continued)

(58) Field of Classification Search
CPC .................. H05K 1/038; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0254; H05K 1/0256; H05K 1/0257; H05K 1/0259; H05K 1/026; H05K 1/0263; H05K 1/0265; H05K 1/0278; H05K
(Continued)

(56) References Cited

U.S. PATENT DOCUMENTS 4,375,379 A * 3/1983 Luetzow .............. H01B 7/0838
156/292
5,139,924 A * 8/1992 Svensson .............. H05K 1/0289
174/250

(Continued)

FOREIGN PATENT DOCUMENTS

CN 1642781 A 7/2005
CN 101421093 A 4/2009
(Continued)

OTHER PUBLICATIONS

Ma, Li, Office Action for Chinese Patent Application No. 2013104529166, mailed Jun. 3, 2016, 9 pages including 5 pages of English translation, State Intellectual Property Office of the People's Republic of China, Beijing, China.
(Continued)

*Primary Examiner* — Ishwarbhai B Patel
(74) *Attorney, Agent, or Firm* — Jordan IP Law, LLC; Todd A. Vaughn

(57) ABSTRACT

A composite component composed of a plastics-fiber composite material, having at least two plies of fiber-reinforced material, and at least one electrical line arranged between the at least two plies of fiber-reinforced material.

17 Claims, 3 Drawing Sheets

(51) Int. Cl.
*B29C 70/88* (2006.01)
*H01B 7/08* (2006.01)

(52) U.S. Cl.
CPC ........... *H05K 1/0393* (2013.01); *H01B 7/0861* (2013.01); *H01B 7/0876* (2013.01); *H05K 1/0224* (2013.01)

(58) Field of Classification Search
CPC .............. 1/0284;H05K 1/0296; H05K 1/0298; H05K 1/036; H05K 1/0366; H05K 1/0373; H05K 1/0393; H05K 7/08; H05K 3/085; H05K 3/008; H05K 3/081; H05K 3/082; H05K 3/084; H05K 7/0807; H05K 7/0823; H05K 7/083; H05K 7/0838; H05K 7/0846; H05K 7/0853; H05K 7/0861; H05K 7/0869; H05K 7/0876; B29C 70/885
USPC .............. 174/250–268, 117 F, 117 FF, 72 A, 174/72 TR; 428/202.1, 221, 297.4, 209, 98, 428/116; 361/767, 772
See application file for complete search history.

(56) References Cited

U.S. PATENT DOCUMENTS

| | | | | |
|---|---|---|---|---|
| 5,281,765 A * | 1/1994 | Iura et al. | ................. | 174/117 F |
| 5,323,534 A * | 6/1994 | Iwasaki et al. | ................. | 29/850 |
| 5,527,997 A * | 6/1996 | Saen et al. | ................. | 174/126.2 |
| 6,148,510 A * | 11/2000 | Yokoi | ................. | H01R 43/0263 174/84 R |
| 6,326,548 B1 * | 12/2001 | Okumura | ............. | H01R 9/0512 174/88 C |
| 7,348,667 B2 * | 3/2008 | Chun et al. | .................... | 257/723 |
| 7,737,370 B2 * | 6/2010 | Aoyama et al. | .............. | 174/389 |
| 2011/0024165 A1 * | 2/2011 | Olden et al. | .................. | 174/257 |

FOREIGN PATENT DOCUMENTS

| | | |
|---|---|---|
| CN | 102186646 A | 9/2011 |
| DE | 4221454 A1 | 3/1994 |
| EP | 1483137 B1 | 4/2007 |
| EP | 2153964 A1 | 2/2010 |
| GB | 2041824 A | 9/1980 |
| WO | 20100004262 A2 | 1/2010 |

OTHER PUBLICATIONS

Ma, Li, Chinese Patent Application No. 2013104529166 First Office Action, Mar. 24, 2015, 5 pages, State Intellectual Property Office of the People's Republic of China, Beijing, China (English translation included).

Ma, Li, Chinese Patent Application No. 2013104529166 Search Report, Mar. 6, 2015, 4 pages, State Intellectual Property Office of the People's Republic of China, Beijing, China (English translation included).

* cited by examiner

COMPOSITE COMPONENT WITH ELECTRICAL LINES

CROSS-REFERENCE TO RELATED APPLICATIONS

The present application claims priority 35 U.S.C. §119 to European Patent Publication No. EP 12187229.5 (filed on Oct. 4, 2012), which is hereby incorporated by reference in its entirety.

TECHNICAL FIELD

Embodiments relate to a composite component composed of a plastics-fibre composite material, having at least two plies of fibre-reinforced material and at least one electrical line arranged between the at least two plies of fibre-reinforced material.

BACKGROUND

A composite material is a combination of at least two or more different active substances which exhibit clearly distinct physical or chemical properties. The resulting composite material combines the physical and/or chemical properties of its constituents. At the same time, the positive properties for the respective application are emphasized, and the least desired properties are suppressed. Here, the components are selected and combined with one another such that each substance is drawn upon to impart its special properties that are required for the present situation.

In the automobile industry, among others, use is increasingly being made of carbon composite material for lightweight components. As a result of the low weight of the composite material, the increase in weight in automobile construction is compensated. Carbon composite materials are used above all for use in safety-relevant regions, for example, as a reinforced collision impact absorber.

For example, European Patent Publication EP 1483137 B1 discloses a collision impact absorber which is reinforced with a metal cable belt, in which the metal cables or wires are arranged in one or more planes. Here, the metal cables are laminated between foils composed of polymer material. For the production of the collision protection mechanism, a regular orientation of the metal cables is expedient, but the metal-plastics composite material is not optimally configured for the absorption of forces.

Great Britain Patent Publication GB 2041824 discloses a composite material composed of carbon-fibre-reinforced plastic in combination with metal-wire woven fabric. Here, the composite material is constructed in an alternating fashion from the reinforced plastic and from the metal laid fabric. Such a construction is expedient for use for homogeneous components with uniform behaviour with respect to forces that are introduced, and, with the metal inlay, also constitutes an electrically conductive material.

SUMMARY

Embodiments solves the problem of producing a component from a composite material, which component, aside from the optimization of the mechanical properties of the component, exhibits electrical functionality.

In accordance with embodiments, the problem may be solved by way of a composite component composed of a plastics-fibre composite material, having at least two plies of fibre-reinforced material and at least one electrical line arranged between the at least two plies of fibre-reinforced material that may be connected to electrical terminals.

In accordance with embodiments, it may be advantageous for an electrical terminal to be provided which is either composed of a component protruding out of the composite material or which is realized by protruding lines.

In accordance with embodiments, the electrical line may advantageously be part of a ply of metal wires or metal cords. Here, it may be advantageous for a plurality of metal cords, e.g., more than one individual wire, to be used, and for the at least two wires to be twisted or stranded and/or braided to form a metal cord.

It is specifically as a result of the connection of the composite material to the metal cords that the desired elasticity of the component is attained, which is used, for example, for safety-relevant components in the field of collision protection. The stranding of the metal wire to form metal cords leads to an increased elasticity, which is an ideal complement to the for example brittle material of a carbon composite plastic. The elasticity of the material is advantageously increased through the use of steel for the metal cords.

In accordance with embodiments, it may also be advantageous for the metal cords to be connected, for example, woven, to form a bidirectional metal laid fabric. In this way, the elasticity is increased not only in one direction, and the component as a whole may be optimized.

For the construction of the composite component, it may be advantageous for the metal cords to be situated between or on the fibre-reinforced plies of the composite component. In this way, the properties of the composite material may be optimized, because a high level of flexibility for the positioning of the metal cords is provided.

In accordance with embodiments, it may further be advantageous that, in the case of steel cords being used as metal parts and use being made of plies of carbon-fibre-reinforced material, a ply of insulating material is provided between the metal parts and the carbon fibres in order to minimize corrosion. Here, the insulating material may advantageously be a ply of plastic of the plastics composite matrix. Alternatively, it may be advantageous to use glass-fibre-reinforced plastic or a glass fibre which both is used as an insulating ply and also increases the plasticity of the composite and counteracts the brittle behaviour of the carbon layers. If glass-fibre-reinforced plastic is used, it is possible to produce components and structures whose structure is rather preserved in the event of a collision and in which the metal inlays are protected against corrosion. The use of glass fibres alone as an insulating and dimensionally stable spacer is also possible.

In accordance with embodiments, it may also be advantageous for entire bodies to be produced from the composite components and for the electrical lines to be connected between the components. In this way, the retroactive laying of lines in the passenger compartment and the introduction of the different laying means is dispensed with.

In accordance with embodiments, a composite component may include at least one of the following: at least two layers composed of a fibre-reinforced material; electrical terminals; and at least one electrical line arranged between the at least two layers of fibre-reinforced material and connected to the electrical terminals.

In accordance with embodiments, a composite component for a motor vehicle may include at least one of the following: a pair of spaced apart first layers composed of a fibre-reinforced material; electrical terminals; a pair of second layers composed of a metal material and arranged between the first layers and connected to the electrical terminals; and an insulating layer arranged between each second layer and a corresponding first layer.

DRAWINGS

Embodiments will be illustrated by way of example in the drawings and explained in the description below.

DESCRIPTION

Figure 1:
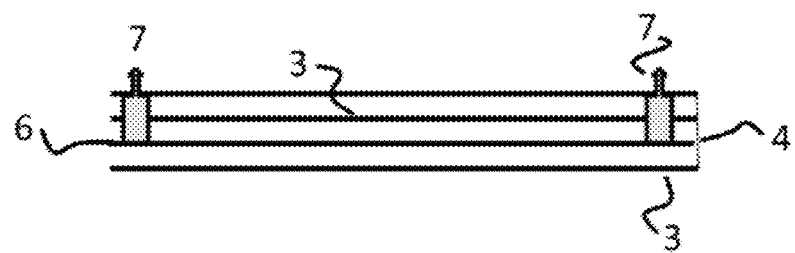
FIG. 1 illustrates a composite component, in accordance with embodiments.

FIG. 1 illustrates in accordance with embodiments a construction of layers. The layers are prepared on a planar surface for further processing. As illustrated in FIG. 1, different pre-impregnated fibre layers composed of fibre-reinforced material, for example, carbon fibres 3, are provided spaced apart from each other. The pre-impregnated fibre layers are referred to as prepreg and may be composed of fibres and of an unhardened thermosetting plastics matrix.

At least one layer 4 composed, for example, of metal cords is spatially arranged on and/or over or between the carbon-fibre layers 3. The layer 4 includes at least one electrical line 6 which is laid in a continuous fashion between two electrical terminals 7. In addition to the electrical line 6, metal cords may be inlaid as a metal laid fabric. The construction of the individual layers 4 takes place in accordance with the demands on the composite material, and may be performed in an automated manner.

The electrical terminals 7 are schematically illustrated in the drawing. The electrical terminals 7 may be plug connectors of different types or else simple elongations of the electric lines, which elongations are led to the outside. The electrical lines 6 may be specially laid cables, or a part of the metal laid fabric is used not only for its reinforcement task but also as an electrical line. Here, individual metal wires of the metal laid fabric, or else entire bundles of metal wires or metal cords, are contacted. The electrical insulation of the metal wires with respect to one another is realized by way of the matrix. If appropriate, those parts of the metal laid fabric which are to be contacted must be provided with insulation before the introduction of the plastic.

The layered component is placed into a tool which has a lower tool part 2 and an upper tool part. In the tool, the pre-laid component is deformed if appropriate and is either hardened in an autoclave or, with the aid of an RTM process, is injected with a moulding compound and hardened under the action of heat and pressure.

Figure 5:
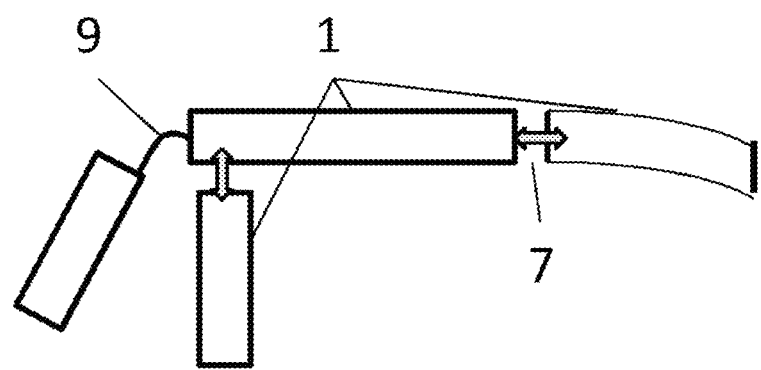
FIG. 5 illustrates the assembly for a body, in accordance with embodiments.

Components of such type may be used for the production of entire bodies as illustrated in FIG. 5, in which there is no need for additional electrical lines 6 to be laid in the passenger compartment. The electrical terminals 7 are connected to further composite material components 1 either directly or via couplings 9. Here, the couplings 9 are either rigid or flexible components. In this way, a built structure for electrical lines 6 is attained which dispenses with all laying mechanisms in the vehicle and which also performs the insulation of the electrical lines 6.

Figure 2:
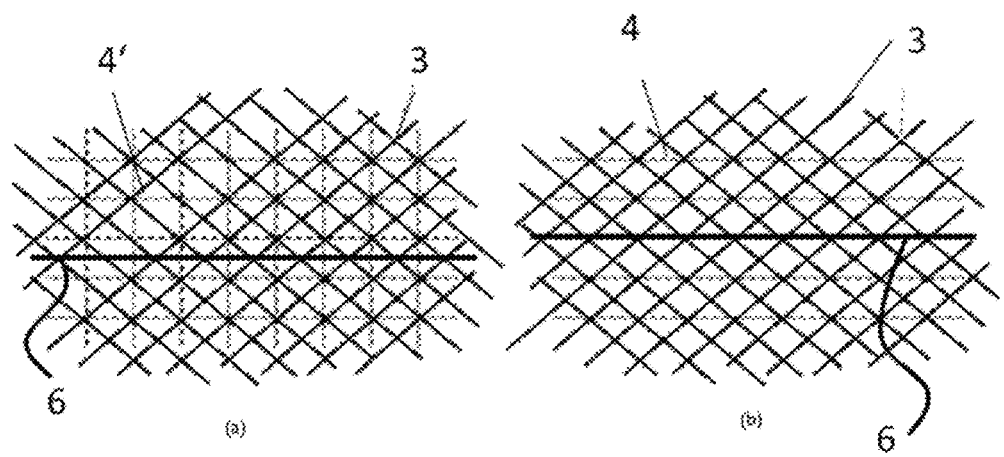
FIG. 2 illustrates a schematic illustration of the metal laid fabric, in accordance with embodiments.

FIG. 2 illustrates an exemplary arrangement of prepregs in accordance with embodiments. The carbon-fibre-reinforced material 3 is in this case a uniform woven fabric composed of carbon fibres. For implementation of embodiments, however, the use of carbon-fibre-reinforced material 3 in which the carbon fibres are oriented in a predetermined direction may also be provided. On the right-hand side of FIG. 2, the metal laid fabric 4 is oriented horizontally. The metal laid fabric has metal cords which are produced from at least two wires which are twisted around one another. The metal cords that are bundled together from wires that may be laid parallel to and spaced apart from one another. An exemplary electrical line 6 is connected directly to the metal cords, but may also be introduced separately from the metal cords. On the left-hand side of FIG. 2, the metal cords are arranged perpendicular to the horizontal arrangements of further metal cords and form a metal cord grid as a metal laid fabric, the latter being inlaid as a whole into the component. Here, the electrical line 6 is introduced separately from the metal laid fabric. Since the electrical line 6 does not imperatively simultaneously perform the task of enhancing the elasticity of the composite material, the electrical line 6 may be laid such that it connects the electrical terminals of the component in an optimal manner.

The arrangement of the metal cords illustrated in FIG. 2 is merely one possible embodiment. The metal cords may, for example, form a metal laid fabric which is of reinforced form at one point by way of a denser lay pattern of the metal cords and which is of weaker form at other points by way of a less dense lay pattern. It is also not necessary for the metal cords to be parallel.

Figure 3:
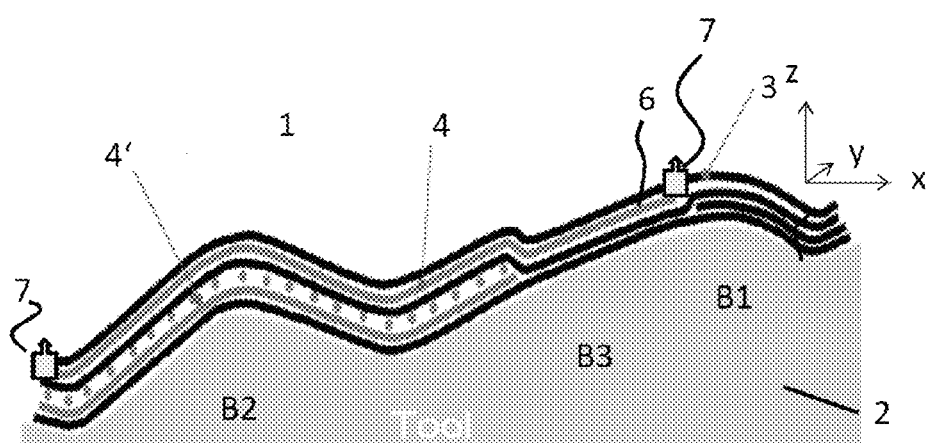
FIG. 3 illustrates a three-dimensional composite component, in accordance with embodiments.

FIG. 3 illustrates a further component which is constructed on the surface of a lower tool part 2. The component 1 is in turn composed of different, alternating layers of carbon-fibre-reinforced plies 3 or unidirectional metal laid fabrics 4 or bidirectionally oriented metal laid fabrics 4'. By way of the different orientation of the metal cords in the metal laid fabrics 4, 4', the component that is produced is optimized in terms of its elasticity.

As may be seen from FIG. 3, the component has different regions B1, B2, B3, which are defined in the x, y plane and not in the layer plane z of the component. The regions B1, B2, B3 may be of different sizes and may have different shapes in the x, y plane. Only plies of carbon-fibre-reinforced material are provided in region B1 of the component. In region B2, the component has two plies of metal cords, and in region B3, the component has a ply with a metal-cord laid fabric. A second layer is provided on and/or over a first layer composed of carbon-fibre-reinforced plastic. The second layer, in this case alternatively, may be composed of carbon-fibre-reinforced plastic or a metal laid fabric. Depending on the loading of the individual regions B1, B2, B3, metal laid fabrics or further carbon-fibre-reinforced plastics plies are layered one on and/or over the other.

Figure 4:
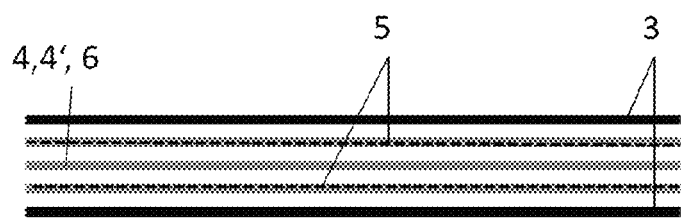
FIG. 4 illustrates a composite component with insulation layers, in accordance with embodiments.

Metal wires, such as, for example, steel wires, may be used for the production of the metal laid fabric. If steel wires are used, it must be taken into consideration that corrosion occurs on the steel wires if the steel comes into contact with the carbon fibres. To minimize this problem, as illustrated in FIG. 4, an insulation layer 5 is inserted between metal laid fabrics 4, 4', in this case, between the steel laid fabric 4, 4', 6 and the carbon-fibre layers 3. The insulation layer 5, in accordance with embodiments, may be a layer of resin or the plastic of the plastics matrix. The insulating layer 5 may be introduced in the production process and producing and filling out a spacing between the steel laid fabric 4, 4', 6 and the carbon fibres 3. Alternatively, the insulation layer 5 may be produced from glass-fibre-reinforced plastic, which advantageously enhances the plasticity of the plastics composite which counteracts the brittle behaviour of the carbon-fibre layers. In an embodiment using an insulating glass-fibre-plastic layer 5, the component may rather be preserved in the event of a collision, and the steel inlays are at the same time protected against corrosion. Further possible insulating layers 5 are materials such as cellulose, basalt and the like, which have purely an insulation effect but no further influence on the elasticity of the material.

To prevent the corrosion problem, use is made of aluminium metal cords, which may replace the steel cords.

Alternatively, the electrical lines 6 may be produced from metals such as, for example, copper and/or aluminium and are inlaid in the composite material. The electrical lines 6 may be laid with or without a dedicated insulation layer regardless of whether yet further metal components are inlaid in the composite material. To produce the composite materials, use is made of known plastics matrices and resins.

The term "coupled" or "connected" may be used herein to refer to any type of relationship, direct or indirect, between the components in question, and may apply to electrical, mechanical, fluid, optical, electromagnetic, electromechanical or other connections. In addition, the terms "first," "second," etc. are used herein only to facilitate discussion, and carry no particular temporal or chronological signifimayce unless otherwise indicated.

Those skilled in the art will appreciate from the foregoing description that the broad techniques of the embodiments may be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

What is claimed is:

1. A composite component for a motor vehicle, comprising:
    at least two layers composed of a fibre-reinforced material;
    electrical terminals spaced apart from one another in the at least two layers;
    metal cords of metal wires twisted with one another and arranged between the at least two layers; and
    a third layer, arranged between the at least two layers, composed of bi-directional metal cords of metal wires twisted with one another, the third layer including at least one electrical line arranged between the at least two layers of fibre-reinforced material and connected to the electrical terminals, wherein the at least one electrical line is composed of part of the bi-directional metal cords,
    wherein the composite component is a reinforced collision impact absorber of a body part of the motor vehicle.

2. The composite component of claim 1, wherein the electrical terminals are integrated in the composite component.

3. The composite component of claim 1, wherein the electrical terminals project in the form of electrical lines out of the composite component.

4. The composite component of claim 1, wherein the fibre-reinforced material comprises carbon-fibre-reinforced material.

5. The composite component of claim 4, wherein the at least one electrical line directly or indirectly facilitates an electrical connection between at least two composite components via the electrical terminals.

6. A composite component for a motor vehicle, comprising:
    electrical terminals spaced apart from one another;
    a first layer composed of pre-impregnated, fibre layers of fibre-reinforced material;
    a second layer, spaced from the first layer, and which is composed of pre-impregnated, fibre layers of fibre-reinforced material;
    a third layer composed of bi-directional metal cords of metal wires twisted with one another and arranged between the first and second layers, the third layer including at least one electrical line which is laid in a continuous fashion between the electrical terminals,
    wherein the composite component is a reinforced collision impact absorber of a body part of the motor vehicle.

7. The composite component of claim 6, wherein the electrical terminals are integrated in the composite component.

8. The composite component of claim 6, wherein the electrical terminals project in the form of electrical lines out of the composite component.

9. The composite component of claim 6, wherein the at least one electrical line is composed of twisted and/or braided wires or strands.

10. The composite component of claim 6, wherein the fibre-reinforced material comprises carbon-fibre-reinforced material.

11. The composite component of claim 6, wherein the composite component comprises a part of a body of the motor vehicle.

12. The composite component of claim 11, wherein the at least one electrical line directly or indirectly facilitates an electrical connection between at least two composite components via the electrical terminals.

13. A composite component for a motor vehicle, comprising:
    electrical terminals spaced apart from one another;
    a first layer composed of pre-impregnated, fibre layers of fibre-reinforced material;
    a second layer, and which is composed of pre-impregnated, fibre layers of fibre-reinforced material;
    a third layer composed of at least one ply of metal cords of metal wires twisted with one another and arranged between the first and second layers, the third layer including at least one electrical line between the electrical terminals, wherein the metal cords includes first and second metal cords, the first metal cords being arranged perpendicular to the second metal cords to form a metal cord grid,
    wherein the composite component is a reinforced collision impact absorber of a body part of the motor vehicle.

14. The composite component of claim 13, wherein the electrical terminals are integrated in the composite component.

15. The composite component of claim 13, wherein the electrical terminals project in the form of electrical lines out of the composite component.

16. The composite component of claim 13, wherein the at least one electrical line is composed of twisted and/or braided wires or strands.

17. The composite component of claim 13, wherein the fibre-reinforced material comprises carbon-fibre-reinforced material.

* * * * *